(12) United States Patent
Murphy et al.

(10) Patent No.: US 8,427,161 B2
(45) Date of Patent: Apr. 23, 2013

(54) METHOD AND APPARATUS FOR GENERATING HYPERPOLARIZED MATERIALS

(75) Inventors: Lawrence Elwood Murphy, Shorewood, WI (US); Emil Markov Georgiev, Hartland, WI (US); Erik Paul Kemper, Franklin, WI (US); Ryan Jerome Ramos, Greenfield, WI (US)

(73) Assignee: General Electric Company, Schenectady, NY (US)

( * ) Notice: Subject to any disclaimer, the term of this patent is extended or adjusted under 35 U.S.C. 154(b) by 614 days.

(21) Appl. No.: 12/642,408

(22) Filed: Dec. 18, 2009

(65) Prior Publication Data

US 2011/0150706 A1  Jun. 23, 2011

(51) Int. Cl.
*A61B 5/055* (2006.01)
*B01J 19/08* (2006.01)
*B01J 19/00* (2006.01)
*G01N 1/44* (2006.01)
*G01R 33/28* (2006.01)
*G01R 33/62* (2006.01)
*G01V 3/00* (2006.01)

(52) U.S. Cl.
USPC ......... 324/321; 324/306; 324/303; 324/318; 62/51.1; 62/6; 422/105; 422/186.01

(58) Field of Classification Search .......... 324/300–322; 62/45.1, 6, 51.1; 422/105, 82.05; 600/407–435
See application file for complete search history.

(56) References Cited

U.S. PATENT DOCUMENTS

| | | | |
|---|---|---|---|
| 3,222,269 A * | 12/1965 | Stanton | 204/270 |
| 3,464,672 A * | 9/1969 | Massa | 366/115 |
| 3,515,654 A * | 6/1970 | Bordalen et al. | 205/725 |
| 4,633,682 A * | 1/1987 | Laskaris | 62/51.1 |
| 4,635,450 A * | 1/1987 | Laskaris | 62/51.1 |
| 4,635,451 A * | 1/1987 | Laskaris | 62/51.1 |
| 6,466,814 B1 | 10/2002 | Ardenkjaer-Larsen et al. | |
| 7,102,354 B2 * | 9/2006 | Ardenkjaer-Larsen et al. | 324/321 |
| 7,372,274 B2 * | 5/2008 | Ardenkjaer-Larsen et al. | 324/321 |
| 2004/0049108 A1 * | 3/2004 | Ardenkjaer-Larsen et al. | 600/412 |
| 2004/0066193 A1 * | 4/2004 | Ardenkjaer-Larsen et al. | 324/309 |
| 2005/0225328 A1 * | 10/2005 | Ardenkjaer-Larsen et al. | 324/321 |
| 2006/0192559 A1 * | 8/2006 | Ardenkjaer-Larsen et al. | 324/321 |
| 2008/0104966 A1 * | 5/2008 | Stautner | 62/6 |
| 2008/0240998 A1 | 10/2008 | Urbahn et al. | |
| 2008/0242974 A1 | 10/2008 | Urbahn et al. | |
| 2011/0150706 A1 * | 6/2011 | Murphy et al. | 422/105 |
| 2012/0117985 A1 * | 5/2012 | Urbahn et al. | 62/45.1 |
| 2012/0244038 A1 * | 9/2012 | Tao et al. | 422/82.05 |

* cited by examiner

*Primary Examiner* — Patrick Assouad
*Assistant Examiner* — Tiffany Fetzner
(74) *Attorney, Agent, or Firm* — Fletcher Yoder, P.C.

(57) ABSTRACT

Methods and apparatuses for generating hyperpolarized materials are disclosed. In one embodiment, a flexible fluid path is provided for use in a polarizer system. In a further embodiment, a polarizer system is provided with an electromechanical assembly for controlling the movement of a fluid path, when present, within a sample path of the polarizer system. In a further embodiment, a polarizer system is provided having a sample path entry point at a convenient height for use by a user standing on the ground.

19 Claims, 5 Drawing Sheets

METHOD AND APPARATUS FOR GENERATING HYPERPOLARIZED MATERIALS

BACKGROUND OF THE INVENTION

The subject matter disclosed herein relates generally to nuclear magnetic resonance imaging, and more particularly to the generation of contrast materials for use with nuclear magnetic resonance imaging technologies.

The nuclear magnetic properties of compositions, including those materials forming the body, have been utilized in the field of non-invasive imaging to provide both structural and functional information about the internal workings of the body. In particular, magnetic resonance imaging (MRI) and nuclear magnetic resonance (NMR) spectroscopy have both found used in the field of medical diagnostics and research. In general, such magnetic resonance imaging systems operate based on the interactions between one or more compositions of interest and various magnetic fields produced by an imaging system. For example, certain nuclear components, such as hydrogen nuclei in water molecules, have characteristic behaviors in response to the external magnetic fields generated by an MRI or NMR system. One response includes the spin of certain nuclear components in varying relations to one another. The precession of spins of such nuclear components can be influenced by manipulation of the magnetic fields to generate signals that are indicative of the responses and that can be detected, processed, and used to derive useful structural information (e.g., an image) and/or functional information (e.g., a composition or the metabolism of such a composition).

To enhance the signal generated by the magnetic resonance process, a polarized imaging agent can be administered to the subject undergoing imaging. Such polarized materials may have a short life span and are therefore produced at or near the imaging site for timely administration to the subject. However, the equipment used in the production of such polarized materials may be cumbersome and/or awkward to use, making the production process undesirably difficult.

BRIEF DESCRIPTION OF THE INVENTION

In one embodiment, a flexible fluid path is provided. The flexible fluid path includes a flexible double-walled tube comprising an inner tube and an outer tube. The flexible fluid path also includes a terminal portion in fluid communication with both the inner tube and the outer tube. The flexible fluid path also includes a first vessel in fluid communication with only one of the inner tube or the outer tube.

In a further embodiment, a polarizer system is provided. The polarizer system includes a vacuum chamber as well as a cryogenic cooling system and a magnet disposed within the vacuum chamber. The polarizer system includes a sample path extending through the cryogenic cooling system and an electro-mechanical assembly configured to control the movement of a fluid path, when present, within the sample path.

In an additional embodiment, a polarize system is provided. The polarizer system includes a vacuum chamber as well as a cryogenic cooling system and a magnet disposed within the vacuum chamber. The polarizer system includes a sample path extending through the cryogenic cooling system. The sample path has an entry point disposed at a height within a suitable control zone for access by a user standing on the ground

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION OF THE INVENTION

The present disclosure generally relates to a polarizer system and fluid path for use in such a system. The polarizer system and fluid path are used in the production of polarized agents to be administered to a subject undergoing a magnetic resonance imaging procedure. In particular, the polarizer system discussed herein is used to improve the polarization of nuclear spins of a sample provided in a solid phase, i.e., a frozen sample. The sample is then dissolved in a solution and administered to a patient undergoing imaging to enhance the imaging process. Such techniques are commonly referred to as hyperpolarization techniques. As used herein, the term "polarize" refers to the modification of the physical properties of a material (e.g., the sample) to enhance the properties of the material in a magnetic resonance imaging process. Likewise, the term "hyperpolarize" refers to polarizing a material at a level beyond what is observed at room temperature and at 1 Tesla.

In one embodiment, the polarizer system is configured to allow the fluid path to be loaded by a technician who remains on the ground (i.e., the technician does not have to climb up a ladder or other object) and who performs the loading operation between waist and chin level (e.g., at approximately chest height). For example, in one such embodiment, the fluid path loading operation is performed at a height between approximately 3 feet and approximately 5 feet from the floor on which the polarizer system rests. In one such embodiment, the fluid path if formed from a flexible material that allows the path to bend during the loading process and during operation. An automated apparatus may be provided to facilitate loading of a portion of the fluid path into the polarizer system. In certain implementations, more than one fluid path may be loaded into the polarizer system concurrently.

Figure 1:
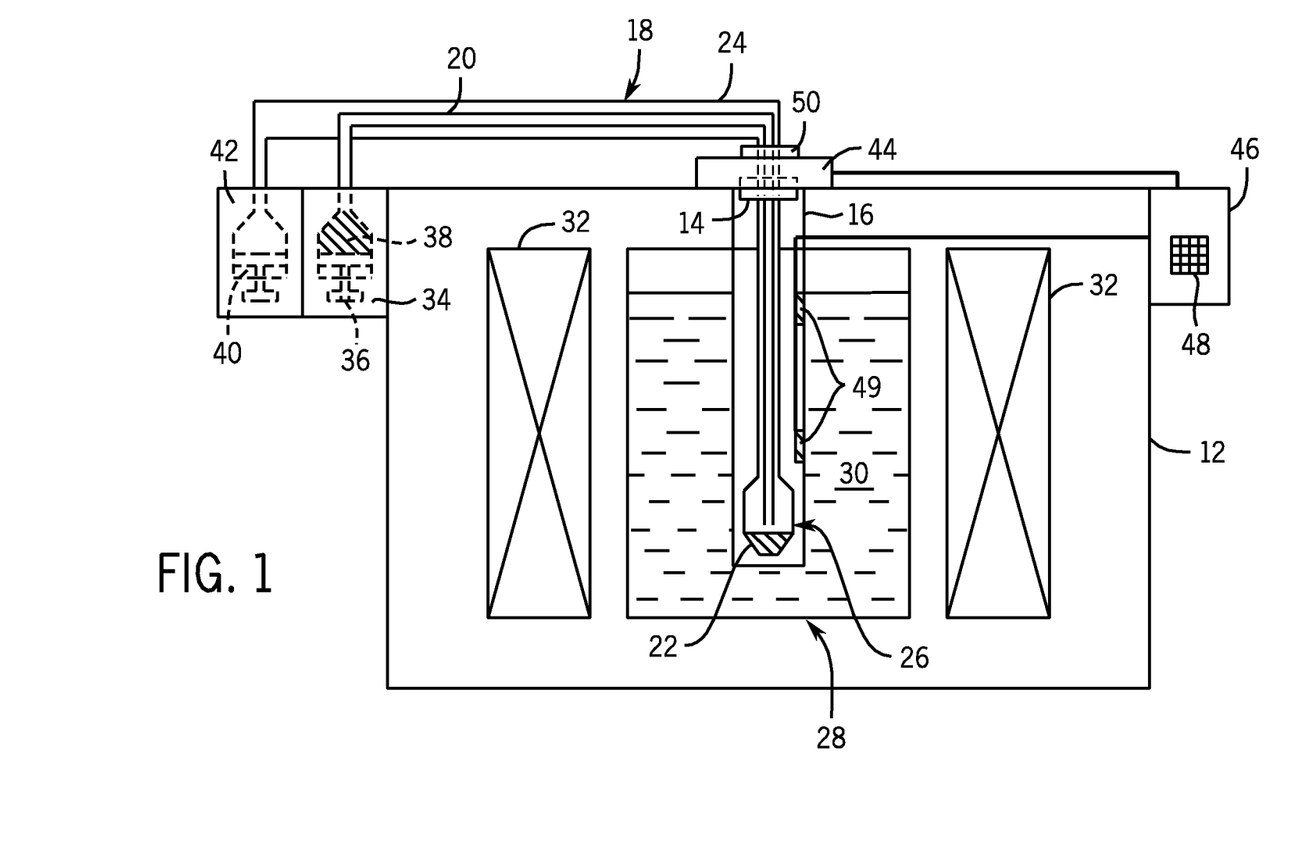
FIG. 1 depicts a block diagram of an embodiment of a polarizer system and fluid path in accordance with one embodiment of the present disclosure.

With the foregoing in mind and turning to FIG. 1, a simplified schematic diagram of a polarizer system 10 is depicted. In the depicted embodiment, the polarizer system 10 includes a vacuum chamber 12 that surrounds the internal components of the system. The depicted vacuum chamber 12 includes an antechamber or air lock 14 that seals a sample path 16 through which a sample is inserted into the polarizer system 10.

In the depicted example, a fluid path 18, here depicted as a flexible, double walled tube, is inserted into the sample path 16. In such a double-walled implementation, an inner tube 20 may be used to deliver a solvent to a sample 22 at a terminal portion 26 of the fluid path 18 and an outer tube 24 may be used to recover a solution of the dissolved sample. In other embodiments, this arrangement may be reversed such that the outer tube 24 may be used to deliver the solvent to the sample 22 and the inner tube 20 may be used to recover a solution of the dissolved sample. In certain embodiments, the terminal portion 26 of the fluid path 18 contains the sample 22 within a vial or other sample container provided as an attached or integral portion of the fluid path 18. In general, the fluid path 18 provides a sterile barrier between the sample 22 (and the resulting solution generated using the sample 22) and the surrounding environment. The sample 22 may be frozen during hyperpolarization and subsequently dissolved for injection into a patient undergoing imaging. In one embodiment, the sample 22 may be $^{13}C_1$-pyruvate, though other agents may also be provided as the sample 22.

The sample path 16 extends through a cryogenic cooling system 28 (such as a liquid helium bath 30) that cools both the sample 22 and a magnet 32 (such as a superconducting magnet). When the fluid path 18 is inserted into the sample path 16, the sample 22 contained within the fluid path 18 is positioned within the magnet 32, which surrounds the sample path 16. The cryogenic cooling system 28 and magnet 32 together act to hyperpolarize the sample 22. In one embodiment, the magnet 32 provides a magnetic field on the order of 3.5 Tesla or higher to hyperpolarize the sample 22.

The depicted polarizer system 10 also includes a heater component 34 in which a pressure vessel or syringe 36 may be situated. The pressure vessel or syringe 36 may be attached to or proved as part of the fluid path 18 and may be filled with a dissolution medium 38 (e.g., a solvent). When the pressure vessel or syringe 36 is placed within the heater component 34, the heater component can heat the dissolution medium 38 and/or can maintain the dissolution medium 38 at an elevated temperature. In one embodiment, the heater component 34 is suitable for heating the dissolution medium 38 to a temperature suitable for dissolving the cryogenically frozen sample 22.

The fluid path 18 may also include or be attached to a product vessel or syringe 40 that receives the dissolved and hyperpolarized sample. For example, once generated, the hyperpolarized sample solution may be transferred into the product vessel or syringe 40, which may be removed by a clinician and used to administer the dose of hyperpolarized sample solution to a patient undergoing imaging. In one embodiment, the vessel or syringe 40 used to receive the sample solution may be disposed in a holding receptacle 42 while the hyperpolarization and dissolution process is performed.

In certain embodiments the receptacle 42 includes one or more quality testing devices that perform automated quality control tests on the hyperpolarized solution produced by the polarizer system 10. Such quality control tests may be performed prior to the hyperpolarized solution entering the syringe 40 or after the hyperpolarized solution has filled the syringe 40. In addition, the receptacle 42 may include structures (e.g., valves, fluid inlets, and so forth) for controlling the pressure of the hyperpolarized solution (such as to adjust the temperature of the hyperpolarized solution) and/or for diluting the hyperpolarized solution with additional fluid, such as water or saline (such as to adjust the temperature, concentration, and/or pH of the hyperpolarized solution). For example, the temperature of the hyperpolarized solution may be adjusted from about 80° C. to about 50° C. or lower (e.g., 37° C. or 38° C.). The quality control tests and/or temperature adjustments may be performed prior to placing the hyperpolarized solution in the syringe 40 for patient injection.

In addition, the polarizer system 10 may include a loading assembly 44 (such as an electro-mechanical loading assembly) that may aid in the loading and unloading of the fluid path 18 in the polarizer system 10. For example, in one embodiment the loading assembly 44 may engage a portion of the fluid path 18 containing the sample 22 in a designated receptacle or location. Once received at this location, the loading assembly may automatically (or after initiation by a user) engage the fluid path 18 and lower the portion of the fluid path 18 containing the sample 22 into the polarizer system 10 such that the sample 22 is at a specified location within the system 10 for a specified time. In one embodiment, the loading assembly may also control the temperature and administration of the dissolution medium 38 for dissolving the hyperpolarized sample. In one such embodiment, an electro-mechanical actuator assembly in the heater component 34 applies pressure to a syringe 36 or vessel containing the dissolution medium 38, as described below, such that the dissolution medium 38 is forced through a solvent path, such as inner tube 20, of the fluid path 18 to reach the sample.

In the depicted embodiment, the operation of the loading assembly 44, the heater component 34, and/or the receptacle 42 may be controlled by control circuitry 46. For example, such control circuitry 46 may control the loading of a fluid path 18 into the sample path 16 by controlling the operation of one or more rollers, motors, or other mechanized components of the loading assembly 44. In one embodiment, the control circuitry 46 executes an automated loading routine, either upon sensing a fluid path in the vicinity of the loading mechanism 44 or upon receiving a user input. In one such embodiment, the control circuitry 46 operates a motor connected to rollers engaged with the fluid path 18 so that the rollers are rotated, causing the engaged fluid path to be fed into the sample path 16 up to a specified depth and for a specified time. As part of this process, the control circuitry 46 may vary the depth of the terminal portion 26 of the fluid path at different times in the hyperpolarization protocol, e.g., the fluid path may be partially raised when the heated dissolution medium 38 is injected. In addition, in certain embodiments, the control circuitry 46 may receive input from different components of the polarizer system 10, such as temperature information from one or more temperature sensors 49 disposed in the sample path 16. In one such embodiment, the control circuitry 46 may take into account the temperature information in executing a hyperpolarization protocol such that temperature, time, or temperature and time together determine the positioning and/or movement of the fluid path 18 within the sample path 16. Once the hyperpolarization protocol is completed, the control circuitry 46 may cause the fluid path 18 to be unloaded from the polarizer system 10, such as by operation of the motor and rollers.

The control circuitry 46 may also control operation of the heater component 34. For example, the control circuitry 46 may control the temperature at which the heater component 34 maintains the dissolution medium 38 and/or may control the automated injection of the dissolution medium 38 through the fluid path. Likewise, in one embodiment the control circuitry 46 controls the automated quality control tests performed on the sample solution in the receptacle 42 and/or the operation of any air or fluid inlets of valves in the receptacle 42 to adjust the pressure, pH, temperature, and so forth of the sample solution in the receptacle 42. In one embodiment, the control circuitry 46 may include one or more user input structures 48, such as a keys, switches, buttons, and so forth, that a user may interact with to execute or control a hyperpolarizer protocol using the polarizer system 10 and a fluid path 18. For example, a user might push respective buttons, keys, or other control structures to initiate the loading of a fluid path 18, to initiate the injection of the dissolution medium 38, to initiate a quality control test of the hyperpolarized solution, and/or to cause the unloading of the fluid path 18 or of the syringe 40.

Figure 2:
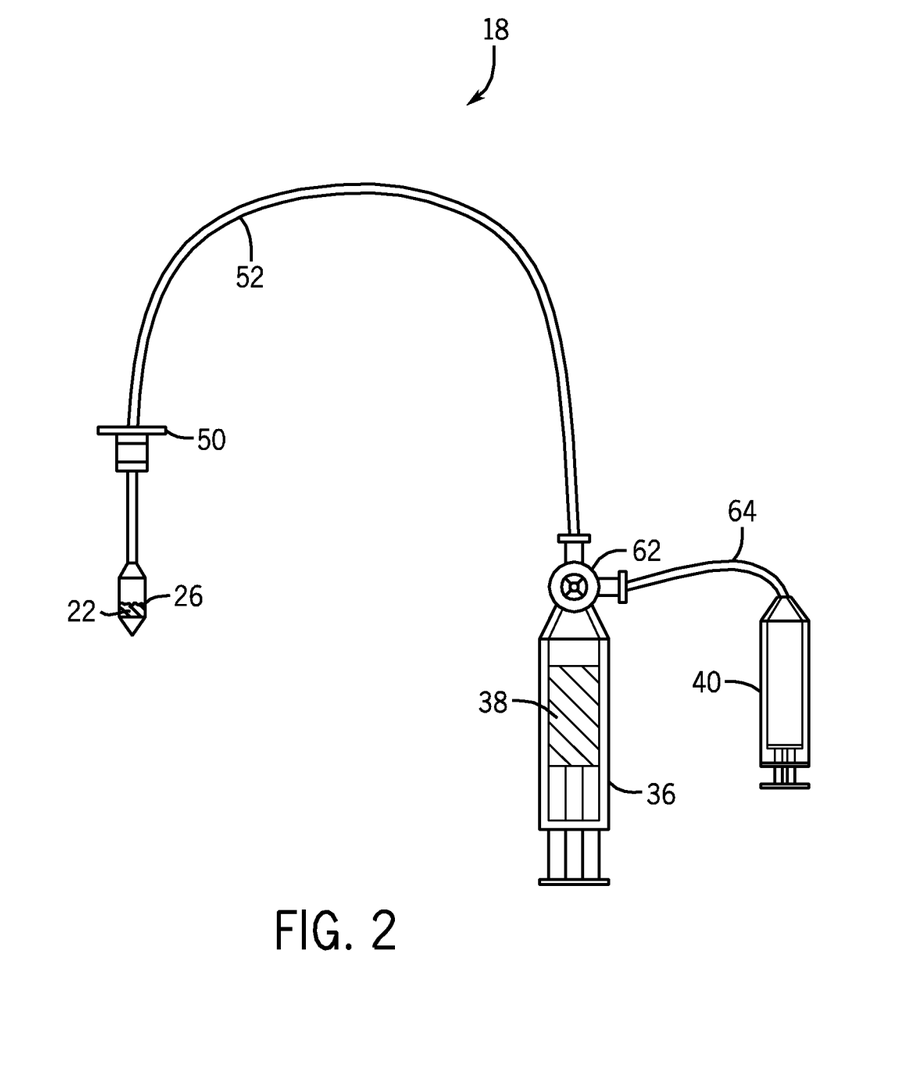
FIG. 2 illustrates a fluid path for use in a polarizer system in accordance with one embodiment of the present disclosure.

Turning to FIG. 2, one embodiment of a fluid path system 18 for use with polarizer system 10 is depicted. In one such embodiment the fluid path 18 is approximately one meter in length. The fluid path 18 can be made from medical grade materials suitable for use in a clinical setting, e.g., in a patient imaging setting where the patient is injected with a solution generated using the hyperpolarized sample 22. Examples of such materials include plastics of validated quality in terms of chemical leaching and in terms of chemical and temperature stability. For example, materials for use in the fluid path 18 may be selected based on their thermal, chemical, and mechanical properties, such as their suitability for use at both superheated temperatures and cryogenic temperatures as well as at high pressures. One example of such a material is polyetheretherketone (PEEK).

In the depicted embodiment the fluid path 18 includes a sliding seal 50 that forms a junction or interface with the vacuum chamber 12 of the polarizer system 10 to help maintain the vacuum. The sliding seal 50 may freely slide along a tubing portion 52 of the fluid path 18 that is inserted into the polarizer system 10 so that an airtight seal is maintained when the fluid path 18 is loaded into the sample path 16.

As noted above, the fluid path 18 may include a terminal portion 26, in the form of an integral or attached vial or sample container, for holding the sample 22. A specified or prescribed dose (e.g., 2 ml) of the sample 22 is typically provided in the terminal portion 26 of the fluid path 18 to be mixed with a dissolution medium 38 (e.g., an aqueous solvent) used to dissolve the sample 22 to form a solution for injection into a patient. In one embodiment, the terminal portion 26 of the fluid path 18 is formed of the same material (such as PEEK) as the double-walled tubing of the fluid path 18. Typically, the material used to form the portions of the fluid path 18 that contact the sample 22 will be non-reactive with respect to the sample 22 and with solvents or solutions that might be used to dissolve the sample 22.

In operation the fluid path 18 is used to position the sample 22 so that it may be polarized in the polarizer system 10 and to facilitate dissolving the sample 22 and transporting the dissolved sample out of the polarizer system 10 to another vessel for administration to a patient. As noted above, in one embodiment the fluid path 18 may include or be connected to a syringe 36 (which may be motor powered or pneumatic in certain embodiments) or other pressure vessel containing the dissolution medium 38 used to dissolve the sample 22. The syringe 36 is used to inject the dissolution medium 38 through the fluid path 18 to the terminal portion 26 where the sample 22 is located.

In one implementation, the dissolution medium 38 may include one or more of a base solvent (e.g., sodium hydroxide) for neutralizing an acid constituent present in the sample 22 (e.g., pyruvic acid), an ion chelator (e.g., EDTA), and/or a buffering agent (e.g., a buffering salt, such as TRIS). In other implementations, the dissolution medium 38 may be water, saline, Ringer solution, or other media which may be suitable for dissolving the sample 22 and generating a solution that is suitable for injection into a patient.

The dissolution medium 38 may be maintained in a heated state (such as via heater component 34 in which the syringe 36 may be positioned) to facilitate dissolution of the frozen sample 22 after the sample 22 has been hyperpolarized but while the sample 22 is still surrounded by the cryogenic cooling system 28. In one embodiment, the dissolution medium 38 may be heated to a temperature of up to about 150° C.

Figure 3:
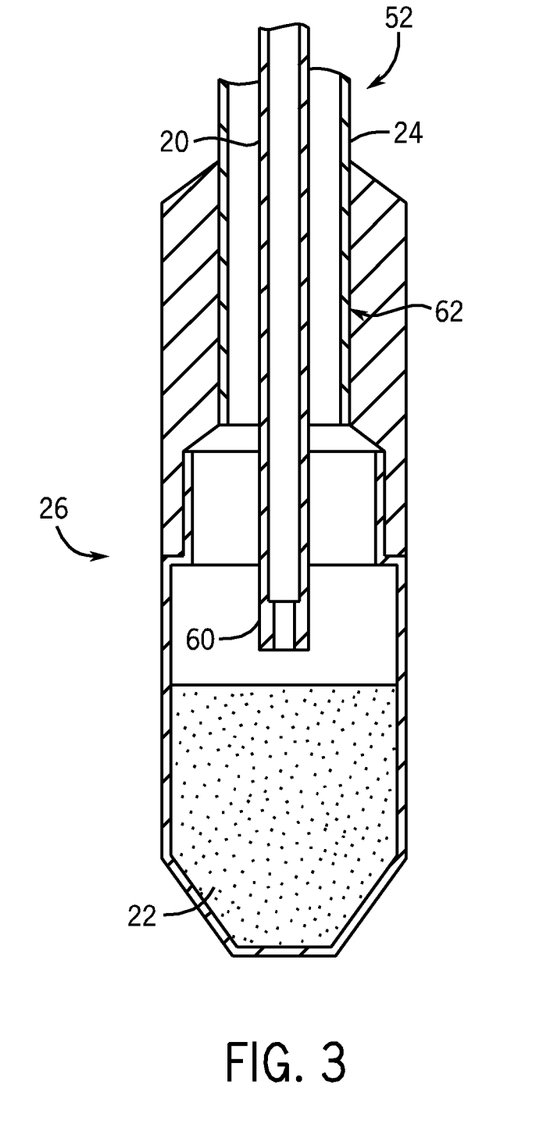
FIG. 3 illustrates a cross-sectional view of a terminal portion of a fluid path in accordance with one embodiment of the present disclosure.

As noted above, in one embodiment the fluid path 18 includes a flexible, double-walled tubing section 52 that is formed from an inner tube 20 and an outer tube 24, as depicted in FIG. 3. In one such embodiment, the inner tube 20 defines a lumen through which the dissolution medium 38 travels from the syringe 36 (as depicted in FIG. 2) to the sample 22 in the terminal portion 26 of the fluid path 18. In the depicted embodiment, an input end of the inner tube 20 is connected to the syringe 36 containing the dissolution medium 38. In one such implementation, the inner tube 20 is composed of a material having low thermal conductivity so as to maintain the temperature (e.g., a heated or elevated temperature) of the dissolution medium 38 as it moves from the syringe 36 to the sample 22. In addition, one or more valves may be located within the inner tube 20 to control the flow of the dissolution medium 38 from the syringe 36 to the sample 22, such as to limit the amount of dissolution medium 38 injected through the inner tube 20 to dissolve the sample 22.

As depicted in FIG. 3, an output end 60 of the inner tube 20 extends into the terminal portion 26 of the fluid path 18 holding the sample 22. Once the heated dissolution medium 38 reaches the terminal portion 26 of the fluid path 18, the dissolution medium 38 mixes with, and dissolves, some or all of the frozen sample 22 to form a solution of the hyperpolarized sample 22. The hyperpolarized solution may be administered (such as by intravenous injection) to a patient undergoing or preparing to undergo magnetic resonance imaging.

To recover the hyperpolarized solution for administration to the patient, a delivery or recovery path is provided in the fluid path 18, such as a lumen or space defined between the outer tube 24 and the inner tube 20, as depicted in FIGS. 1 and 3. Thus, in such an embodiment, the dissolution medium 38 is delivered to the terminal portion 26 of the fluid path 18 via the inner tube 20 and the resulting hyperpolarized solution is recovered from the terminal portion 26 via a separate path defined between the inner tube 20 and the outer tube 24. While nested inner and outer tubes as discussed herein is one possible embodiment, it should be appreciated that other arrangements of tubing, such as side-by-side arrangements are also contemplated as possible implementations. In the depicted embodiment, an end 62 of the outer tube 24 is hermetically sealed to terminal portion 26 of the fluid path 18 that contains the sample 22.

In practice, to recover the hyperpolarized solution, as dissolution medium 38 is injected into the terminal portion 26 to dissolve the sample 22, the dissolution medium 38 continues to be injected thereby increasing the volume of the hyperpolarized solution and forcing the hyperpolarized solution through the solution recovery path defined by the outer tube 24. The hyperpolarized solution flows through the outer tube 24 where it is collected by a receiving vessel, such as a syringe 40 suitable for administering the hyperpolarized solution to a patient. As depicted in FIG. 2, in one embodiment the fluid path 18 includes a valve or fluid redirector 62 that can be connected to tubing attached to the syringe 40 such that the contents of the outer tube 24 of the fluid path are directed through the connected tubing 64 to the syringe 40. In other embodiments, the syringe 40 and/or the connecting tubing may be provided as an integral part of the fluid path 18. One or more delivery valves may be present in the solution recovery path, such as in the outer tube 24. In addition, the solution recovery path for the hyperpolarized solution may also include a filter used to remove an electron paramagnetic agent and/or other processing agents from the hyperpolarized solution.

As noted above, in one implementation, the fluid path 18 is formed using flexible materials, such as PEEK. In such an implementation, the polarizer system 10 may be configured such that the flexibility of the fluid path 18 provides a more manageable user experience. For example, turning now to FIG. 4, an example of a polarizer system 10 is depicted in which the fluid path 18 may be loaded and managed at a height between a users waist and shoulders (i.e., in an optimal control zone), such as between about three feet and five feet above the ground. That is, one or more of the heater component 34 (for holding the syringe 36 containing the dissolution medium 38), the receptacle 42 (for holding the destination syringe 40 for receiving the dissolved hyperpolarized sample), and/or the loading assembly 44 (for loading the terminal portion 26 of the fluid path 18 into the polarizer system 10) are provided within this suitable control zone such that the user may quickly and efficiently perform the polarizing operation and retrieve the polarized sample solution.

Figure 4:
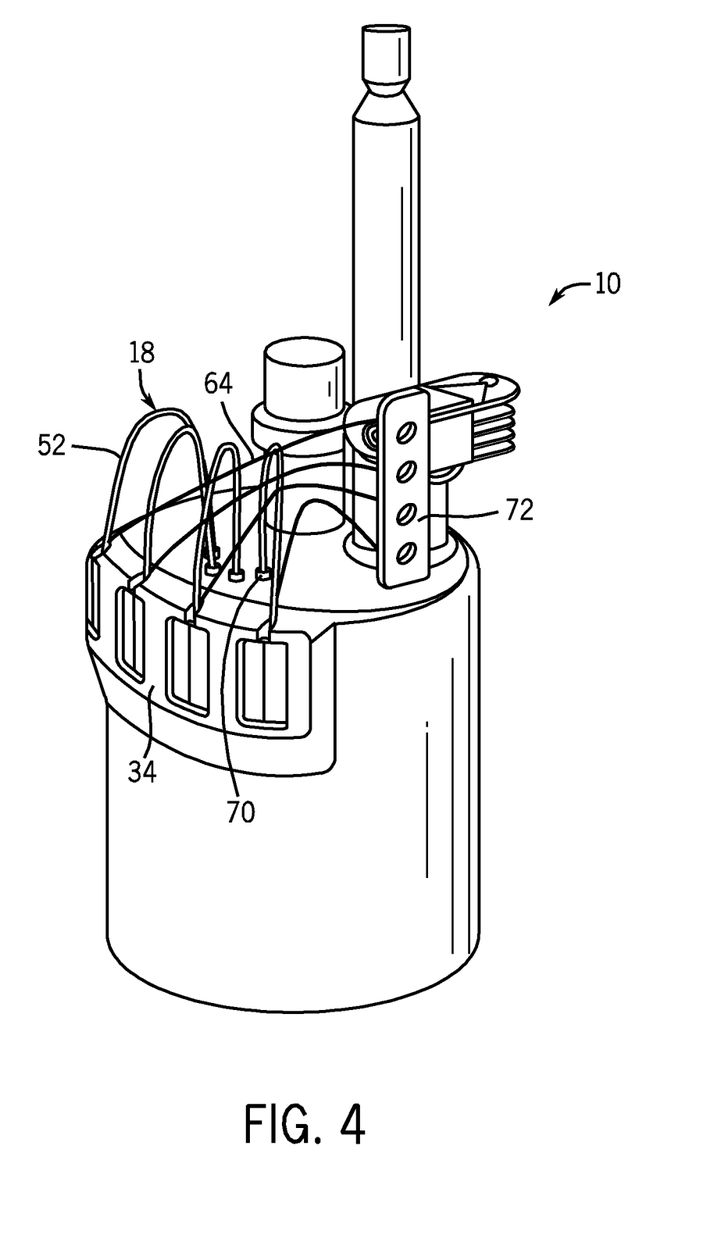
FIG. 4 illustrates a polarizer system suitable for use with a flexible fluid path in accordance with one embodiment of the present disclosure.

For example, in the depicted embodiment, a user may load a syringe 36 filled with dissolution medium 38 in a chamber of the heater component 34 the tubing portion 52 of the fluid path 18 connects the syringe 36 and the terminal portion 26 of the fluid path, which is fed into an opening 70 of the polarizer system. the receptacle 42 holding the destination syringe 40 may or may not be positioned proximate tot the heating component 34, however the destination syringe 40 may be in fluid communication with the fluid path 18 via the connected tubing 64. For example, the receptacle 40 may, in certain embodiments, be situated proximate to quality control analysis circuitry, fluid or air pumps or vents, and or other devices that may be used to test or prepare the final solution of the polarized sample prior to patient administration. In the depicted embodiment, the connected tubing 64 is merely depicted as terminating at a syringe holder 72 provided as the receptacle 42. Thus, in the depicted embodiment, the fluid path 18 as well as the syringes attached to or in communication with the fluid path 18 are all handled at a convenient height (e.g., chest height, such as between four and five feet above the ground) during the loading, polarization, and unloading operations.

Figure 5:
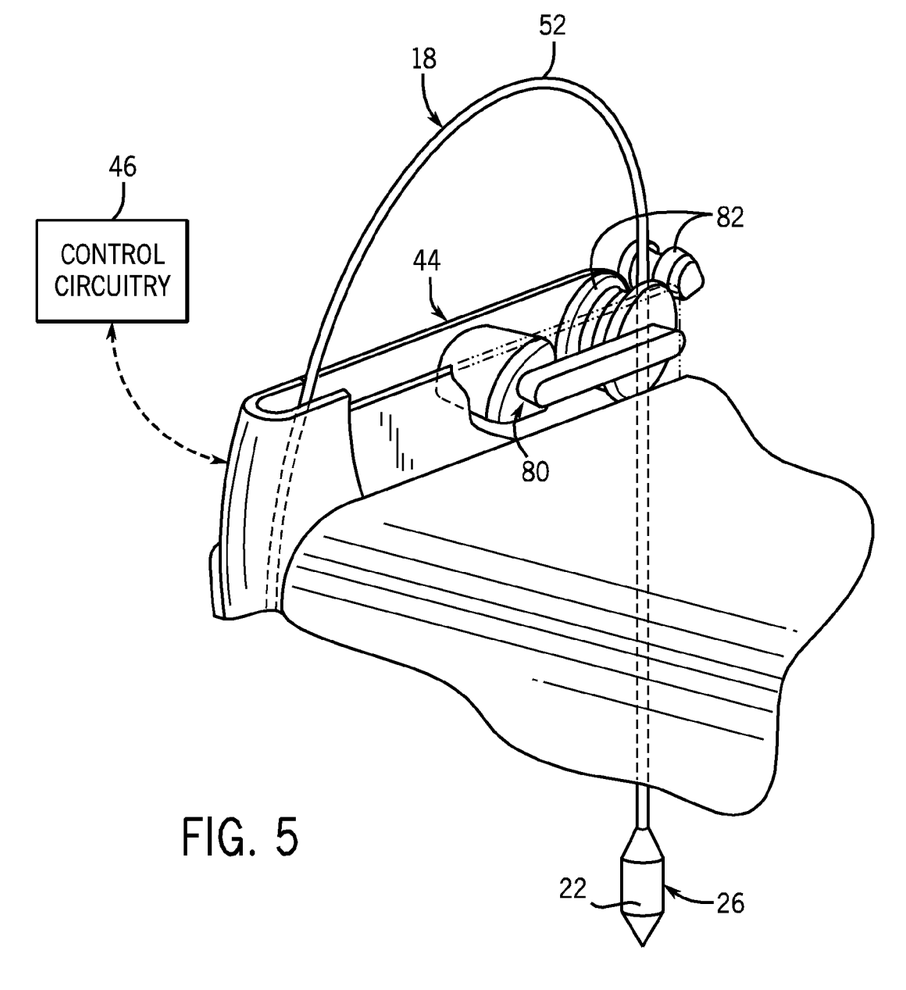
FIG. 5 illustrates an electro-mechanical loading system for use in a polarizer system and components in communication with such a loading system, in accordance with one embodiment of the present disclosure.

As noted above, various aspects of the polarization process may be automated to simplify the process for a user. For example, turning to FIG. 5, a fluid path loading assembly 44, such as an electro-mechanical assembly, may be provided as part of a polarizer system 10, such as that depicted in FIG. 4. In one such embodiment, the loading assembly 44 includes a motor 80 and rollers 82 that act in combination to engage the fluid path 18, to load the fluid path 18 into the polarizer system 10, to control the height of the terminal portion 26 of the fluid path 18 in the polarizer system 10 during the hyperpolarization process, and to unload the fluid path 18 upon completion of the hyperpolarization process. For example, in such an embodiment, a user may insert a portion of the fluid path 18, such as the terminal portion 26, into an opening 70 of the polarizer system 10 where the fluid path engages the rollers 82. Once the fluid path is engaged with the rollers 82, control circuitry 46 in communication with the loading assembly 44 may activate the motor 80 in response to a signal from the rollers 82 that a fluid path 18 is present or in response to an input provided by a user using provided input structures. Once activated the motor 80 may turn the rollers 82 to lower the terminal portion 26 of the fluid path a specified depth into the polarizer system 10. During the course of a polarization operation, the control circuitry 46, in accordance with one or more of specified programming, user inputs, or inputs from the polarizer system 10 (e.g., temperature, time, magnetic field strength, and so forth) may vary the height of the terminal portion 26 of the fluid path 18 within the polarizer system 10. Once the polarization operation is completed, the control circuitry 46 may operate the motor 80 and rollers 82 to raise (i.e., unload) the fluid path 18 from the polarizer system 10 in response to automated programming or a user input.

Further, the control circuitry 46, as previously noted, may automate other functions of the polarizer system 10, such as the operation of the heater component, 34, the administration of the dissolution medium 38, the quality control analysis of the recovered hyperpolarized solution, and so forth. In one embodiment, the control circuitry 46 may be implemented as one or more general or special purpose processors executing suitable code for implementing these functionalities. In such embodiments, the code may be stored in one or more memory or mass storage components (e.g., magnetic storage media, optical storage media, solid state memory devices, and so forth) provides as part of the control circuitry 46 or as a separate component of the polarizer system 10 in communication with the control circuitry 46. In this manner, some or all of the control circuitry functionality described herein may be provided, stored, and executed as computer or processor-implemented code.

Technical effects of the invention include the generation of a hyperpolarized solution for use in a medical imaging procedure. Other technical effects include the automated or facilitated loading and/or handling of a fluid path in a polarizer system used to produce a hyperpolarized solution for image enhancement. In addition, a technical effect as described herein is the use of a flexible fluid path to generate a hyperpolarized solution. Such a flexible fluid path may be used with a polarizer system 10 that allows loading, handling, and/or unloading of the flexible fluid path within a reasonable control zone of a user.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A flexible fluid path of a polarizer system, comprising:
   a flexible double-walled tube comprising an inner tube and an outer tube;
   a terminal portion in fluid communication with both the inner tube and the outer tube;
   a first vessel in fluid communication with only one of the inner tube or the outer tube; and
   a second vessel in fluid communication with only whichever of the inner tube or the outer tube is not in fluid communication with the first vessel, wherein at least the terminal portion of the flexible fluid path is configured to be inserted into a sample path of the polarizer system in order to produce a hyperpolarized sample when the terminal portion is positioned within the sample path.

2. The flexible fluid path of claim 1, comprising a sample material disposed within the terminal portion.

3. The flexible fluid path of claim 2, wherein the sample material comprises $^{13}C_1$-pyruvate.

4. The flexible fluid path of claim 1, wherein the first vessel comprises a syringe.

5. The flexible fluid path of claim 1, wherein the flexible double-walled tube comprises polyetheretherketone (PEEK).

6. The flexible fluid path of claim 1, further comprising a sliding seal disposed about the flexible double-walled tube.

7. The flexible fluid path of claim 1, wherein the terminal portion is integral with the flexible double-walled tube.

8. The flexible fluid path of claim 1, wherein the terminal portion is formed using the same material as the flexible double-walled tube.

9. A polarizer system, comprising:
a vacuum chamber;
a cryogenic cooling system disposed within the vacuum chamber;
a magnet disposed within the vacuum chamber;
a sample path extending through the cryogenic cooling system; and
an electro-mechanical assembly configured to control the movement of a fluid path comprising
a flexible double-walled tube within the sample path, wherein the electromechanical assembly, when in use, moves the fluid path within the sample path in accordance with a pre-configured hyper-polarization protocol in order to produce a dissolved, hyperpolarized material as an output.

10. The polarizer system of claim 9, comprising one or more control circuits capable of controlling operation of the electromechanical assembly.

11. The polarizer system of claim 10 comprising one or more temperature sensors in communication with the one or more control circuits.

12. The polarizer system of claim 10, comprising one or more user interface control structures configured to communicate user commands to the one or more control circuits.

13. The polarizer system of claim 9, wherein the electromechanical assembly is configured to automatically load and unload the fluid path.

14. A polarizer system capable of hyperpolarizing a material, comprising:
a vacuum chamber;
a cryogenic cooling system disposed within the vacuum chamber;
a magnet disposed within the vacuum chamber;
a sample path extending through the cryogenic cooling system; and
a flexible flow path extendable into the sample path, comprising:
a flexible double-walled tube comprising an inner tube and an outer tube; and
a first vessel in fluid communication with only one of the inner tube or the outer tube; and
a second vessel in fluid communication with only whichever of the inner tube or the outer tube is not in fluid communication with the first vessel.

15. The polarizer system of claim 14, comprising a heater component positioned outside the cryogenic cooling system but in communication with the fluid path and configured to receive either or both of the first vessel and the second vessel.

16. The polarizer system of claim 14, comprising a receptacle positioned outside the cryogenic cooling system but in communication with the fluid path and configured to hold the first and second vessels.

17. The polarizer system of claim 14, wherein the first vessel, the second vessel, or a combination thereof, is disposed at a height within a suitable control zone for access by a user standing on the ground.

18. The polarizer system of claim 15, wherein the heating component is disposed at a height within a suitable control zone for access by a user standing on the ground.

19. The polarizer system of claim 16, wherein the receptacle is disposed at a height within a suitable control zone for access by a user standing on the ground.

* * * * *